(12) United States Patent
Summerfelt (10) Patent No.: US 8,658,474 B2
(45) Date of Patent: Feb. 25, 2014

(54) CONTACT AND VIA INTERCONNECTS USING METAL AROUND DIELECTRIC PILLARS

(75) Inventor: Scott R. Summerfelt, Garland, TX (US)

(73) Assignee: Texas Instruments Incorporated, Dallas, TX (US)

( * ) Notice: Subject to any disclaimer, the term of this patent is extended or adjusted under 35 U.S.C. 154(b) by 274 days.

(21) Appl. No.: 13/050,581

(22) Filed: Mar. 17, 2011

(65) Prior Publication Data

US 2011/0165774 A1 Jul. 7, 2011

Related U.S. Application Data

(62) Division of application No. 12/429,375, filed on Apr. 24, 2009.

(60) Provisional application No. 61/088,177, filed on Aug. 12, 2008.

(51) Int. Cl.
*H01L 21/82* (2006.01)

(52) U.S. Cl.
USPC ............................................. 438/129; 257/775

(58) Field of Classification Search
USPC .................. 438/129; 257/734, 774, 775, 776; 29/25.02
See application file for complete search history.

(56) References Cited

U.S. PATENT DOCUMENTS

| 5,861,673 | A  | * | 1/1999  | Yoo et al.         | 257/758 |
| 6,288,454 | B1 | * | 9/2001  | Allman et al.      | 257/797 |
| 8,324,107 | B2 | * | 12/2012 | Zhou et al.        | 438/700 |
| 8,324,742 | B2 | * | 12/2012 | Summerfelt et al.  | 257/797 |

OTHER PUBLICATIONS

Scott R. Summerfelt et al. "Alignment Mark for Opaque Layer," U.S. Nonprovisional Patent Application filed Aug. 1, 2008, U.S. Appl. No. 12/185,003; Dallas, TX.

* cited by examiner

*Primary Examiner* — Mark Tornow
(74) *Attorney, Agent, or Firm* — Rose Alyssa Keagy; W. James Brady; Frederick J. Telecky, Jr.

(57) ABSTRACT

An integrated circuit containing a vertical interconnect that includes a region of interconnect metal continuously surrounding one or more dielectric pillars. The vertical interconnect electrically contacts a top surface of a lower conductive structure. An upper conductive structure contacts a top surface of the vertical interconnect. A process of forming an integrated circuit that includes forming a vertical interconnect that has a region of interconnect metal continuously surrounding one or more dielectric pillars. The vertical interconnect electrically contacts a top surface of a lower conductive structure, and an upper conductive structure contacts a top surface of the vertical interconnect.

8 Claims, 11 Drawing Sheets

CONTACT AND VIA INTERCONNECTS USING METAL AROUND DIELECTRIC PILLARS

CROSS-REFERENCE TO RELATED APPLICATIONS

This application is a division of U.S. application Ser. No. 12/429,375, filed Apr. 24, 2009, which claims the benefit of U.S. Provisional Application No. 61/088,177, filed Aug. 12, 2008, the contents of both are hereby incorporated by reference.

FIELD OF THE INVENTION

This invention relates to the field of integrated circuits. More particularly, this invention relates to vertical interconnects in integrated circuits.

DETAILED DESCRIPTION

The present invention is described with reference to the attached figures, wherein like reference numerals are used throughout the figures to designate similar or equivalent elements. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

The instant invention provides an integrated circuit containing a vertical interconnect which includes a region of interconnect metal continuously surrounding one or more dielectric pillars. In embodiments containing more than one pillar, the pillars may be arranged in a single row, or may be arranged in an array in which every other row of pillars is laterally offset by one-half column spacing. A pattern of the interconnect metal is configured so that every location in the interconnect metal is within a prescribed maximum horizontal distance from a boundary of the interconnect metal region including a perimeter of each pillar.

The vertical interconnect is formed by forming a dielectric layer, removing material from the dielectric layer where interconnect metal is desired so as to leave dielectric pillars in the vertical interconnect region, forming an interconnect metal layer on the dielectric layer which provides interconnect metal in the desired volume, and removing the interconnect metal from over the dielectric layer. Horizontal sizes of the pillars are selected to minimize a combined area of all the pillars in the vertical interconnect region, while providing sufficient adhesion of the pillars to an underlying substrate during formation of the interconnect metal layer and subsequent removal of the interconnect metal from over the dielectric layer. Experiments conducted during development indicate that pillar sizes between 1.5 and 2.0 times a thickness of the interconnect metal layer will meet the recited criteria. The prescribed maximum horizontal distance between any location in the interconnect metal region and a boundary of the interconnect metal region is chosen so that a top surface of the interconnect metal is essentially planar after interconnect metal removal processes have been completed. In particular, dimples or other topology in a top surface of the as-formed interconnect metal layer are substantially not transferred to the top surface of the interconnect metal after the interconnect metal removal processes have been completed. The prescribed maximum horizontal distance will commonly be approximately the thickness of the interconnect metal layer as formed on a vertical surface, for example a sidewall of an etched region in the dielectric layer.

The vertical interconnect may be formed to connect components in a substrate of the integrated circuit (such as transistors, diodes, or capacitors) with elements of a first level of lateral interconnect metallization. The vertical interconnect may also be formed to connect members of lateral interconnect metallization located in two levels. The inventive vertical interconnect may be formed in an integrated circuit without adding fabrication cost or complexity.

Figure 1A:
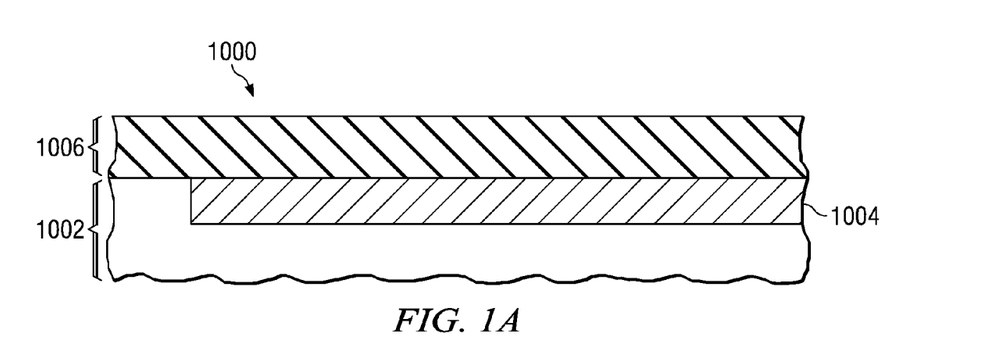
FIG. 1A through FIG. 1E are cross-sections of an embodiment of an integrated circuit containing a vertical interconnect having multiple dielectric pillars, depicted in successive stages of fabrication.

FIG. 1A through FIG. 1E are cross-sections of an embodiment of an integrated circuit containing a vertical interconnect having multiple dielectric pillars, depicted in successive stages of fabrication. Referring to FIG. 1A, the integrated circuit (1000) includes a lower region (1002), which may be a semiconductor substrate or a dielectric layer in an interconnect region. A lower conductive structure (1004) is formed in the lower region (1002). In some embodiments, the lower conductive structure (1004) may be part of a component such as a transistor, diode or capacitor, in the semiconductor substrate of the integrated circuit (1000). In such embodiments, the lower conductive structure (1004) may include polycrystalline silicon, commonly know as polysilicon, or metal silicide, such as nickel silicide, cobalt silicide, titanium silicide or platinum silicide. In other embodiments, the lower conductive structure (1004) may be a lateral interconnect member of a metallization system in an interconnect region of the integrated circuit (1000). In such embodiments, the lower conductive structure (1004) may include tungsten, tungsten nitride, titanium, titanium nitride, titanium tungsten, titanium tungsten nitride, tantalum, tantalum nitride, aluminum, copper, gold, silver or ruthenium.

Fabrication of the vertical interconnect proceeds with formation of a dielectric layer (1006) on a top surface of the lower conductive structure (1004). The dielectric layer (1006) may include one or more sub-layers of silicon dioxide, silicon nitride, silicon oxy-nitride, phospho-silicate glass (PSG), boro-phospho-silicate glass (BPSG), low-k dielectric material such as organo-silicate glass (OSG), carbon-doped silicon oxides (SiCO or CDO) or methylsilsesquioxane (MSQ), or ultra low-k dielectric material such as porous OSG (p-OSG). The dielectric layer (1006) may further include one or more etch stop layers located in a bottom region of the dielectric layer (1006). The etch stop layers may include silicon nitride, silicon carbide, silicon carbide nitride, silicon oxy-carbide, silicon oxy-carbide nitride or aluminum oxide. The dielectric layer (1006) may further include one or more hard mask layers located in a top region of the dielectric layer (1006). The hard mask layers may include silicon nitride, silicon carbide, silicon carbide nitride, silicon oxy-carbide, silicon oxy-carbide nitride or aluminum oxide. The dielectric layer (1006) may be formed by chemical vapor deposition (CVD), plasma enhanced chemical vapor deposition (PECVD), low pressure chemical vapor deposition (LPCVD), atmospheric pressure chemical vapor deposition (APCVD), high density plasma (HDP), an ozone based thermal chemical vapor deposition (CVD) process, also known as the high aspect ratio process (HARP), atomic layer deposition (ALD), or other suitable dielectric layer formation process.

Figure 1B:
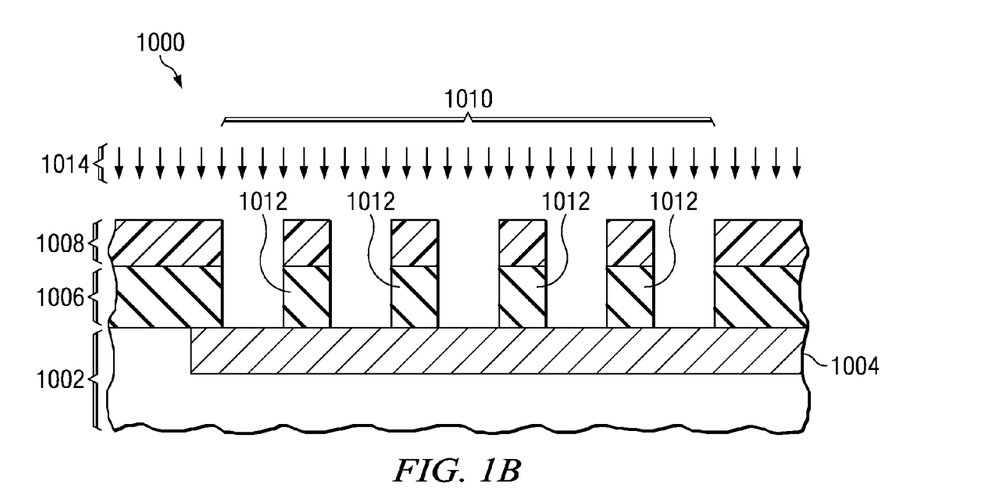

Referring to FIG. 1B, a vertical interconnect photoresist pattern (1008) is formed over the dielectric layer (1006) to define an area for removal of the dielectric material in a vertical interconnect area (1010) by selectively exposing a top surface of the dielectric layer (1006). The vertical interconnect photoresist pattern (1008) includes areas for dielectric pillars (1012) interior to the vertical interconnect area (1010). Material is removed from the dielectric layer (1006) through the photoresist pattern using a plasma etching process (1014) (such as reactive ion etching which may include fluorine ions or possibly other halogen ions) so that the top surface of the lower conductive structure (1004) is exposed in the region where interconnect metal is desired.

Figure 1C:
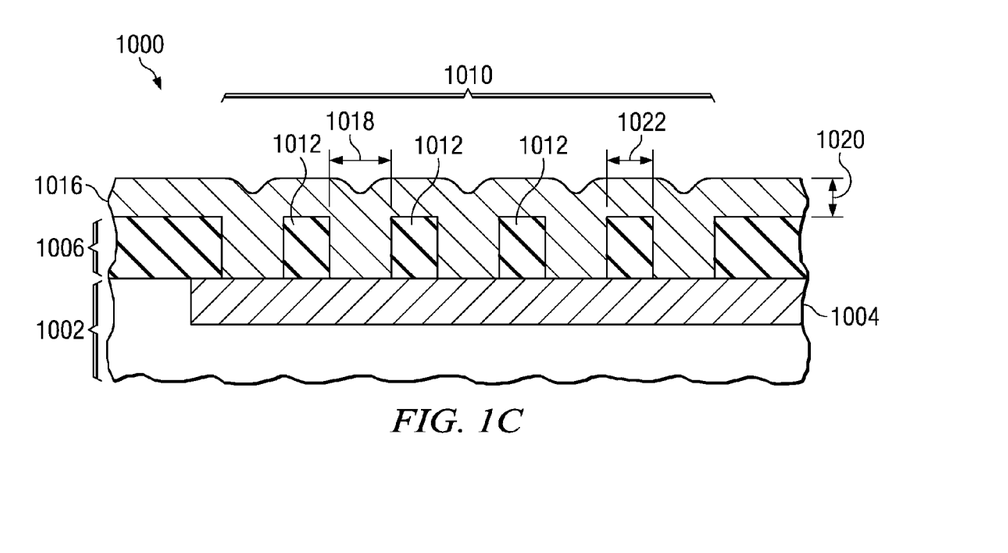

FIG. 1C depicts the integrated circuit (1000) after a layer of interconnect metal (1016) is formed on exposed surfaces of the dielectric layer (1006), pillars (1012) and lower conductive structure (1004). The interconnect metal layer (1016) may include one or more layers of liner metal, such as tungsten, tungsten nitride, titanium, titanium nitride, titanium tungsten, titanium tungsten nitride, tantalum or tantalum nitride which are formed before a subsequent layer or layers of other metal in the layer of interconnect metal (1016). The layer or layers of liner metal may be formed by evaporation, sputtering, PVD, CVD, MOCVD, ion plating, ion beam deposition, molecular beam deposition, ALD or other formations process appropriate for thin metal films. The interconnect metal layer (1016) may further include aluminum, copper, gold, silver or ruthenium. Aluminum may be formed in the layer of interconnect metal (1016) by evaporation, sputtering or PVD. Copper may be formed in the layer of interconnect metal (1016) by evaporation, sputtering, PVD, or electroplating. Gold may be formed in the layer of interconnect metal (1016) by evaporation, sputtering, PVD, electroless plating or electroplating. Silver may be formed in the layer of interconnect metal (1016) by evaporation, sputtering, PVD, or electroplating. Ruthenium may be formed in the layer of interconnect metal (1016) by sputtering, PVD, CVD, MOCVD, ion plating or ALD. A lateral distance (1018) between pillars (1012) is selected so that a top surface of the interconnect metal layer (1016) between the pillars (1012) does not dip below a plane containing the top surface of the dielectric layer (1006). A horizontal size (1022) of the pillars (1012) is selected minimize a combined area of the pillars (1012) in the vertical interconnect area (1010), while providing sufficient adhesion of the pillars (1012) to the lower conductive structure (1004) during the plasma etching process, vertical interconnect photoresist pattern removal and interconnect metal layer formation processes. Experiments conducted during development of embodiments indicate pillar horizontal sizes (1022) between 1.5 and 2.0 times the deposition thickness (1020) of the interconnect metal layer (1016) may provide an acceptable balance between the aforementioned criteria.

Figure 1D:
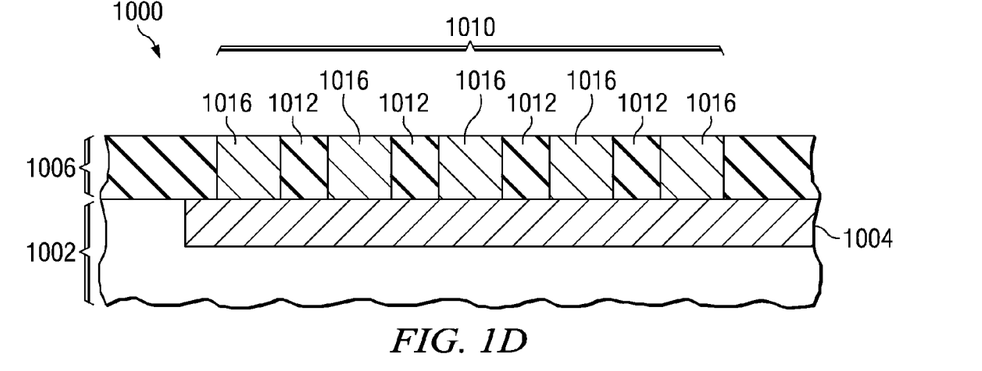

FIG. 1D depicts the integrated circuit (1000) after an interconnect metal removal process which removes interconnect metal (1016) from the top surface of the dielectric layer (1006). The interconnect metal removal process commonly includes a chemical mechanical polish (CMP) operation, in which a removal rate of interconnect metal is more than a removal rate of material from the dielectric layer (1006) (commonly more than 4 times the removal rate of dielectric material).

Still referring to FIG. 1D, in an alternate embodiment, another process may be used to remove interconnect metal (1016) from the top surface of the dielectric layer (1006), for example a plasma etchback followed by a wet clean operation. In another embodiment, a plasma etchback followed by a brief CMP process may be used to remove interconnect metal (1016) from the top surface of the dielectric layer (1006). In yet another embodiment, a planarizing layer of material such as spin-on glass may be formed on a top surface of the interconnect metal (1016), followed by a plasma etchback, and a subsequent wet clean or CMP operation.

After removal of the interconnect metal (1016) from the top surface of the dielectric layer (1006), a top surface of the interconnect metal (1016) may be substantially planar and free of dimples and voids. The continuous interconnect metal region (1016) and the dielectric pillars (1012) may characterize the vertical interconnect.

Figure 1E:
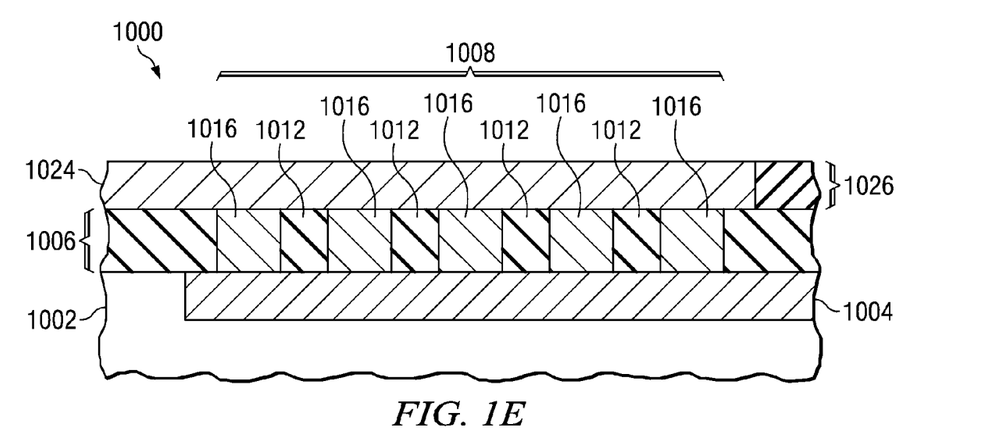

Referring to FIG. 1E, an upper conductive structure (1024) is formed on the top surfaces of the dielectric layer (1006), the dielectric pillars (1012) and the interconnect metal (1016). In some embodiments, the upper conductive structure (1024) may be a lateral interconnect member of a metallization system in an interconnect region of the integrated circuit (1000). In such embodiments, the upper conductive structure (1024) may include tungsten, tungsten nitride, titanium, titanium nitride, titanium tungsten, titanium tungsten nitride, tantalum, tantalum nitride, aluminum, copper, gold, silver or ruthenium. An upper dielectric layer (1026) may also be formed on the top surface of the dielectric layer (1006) around the upper conductive structure (1024).

Figure 2A:
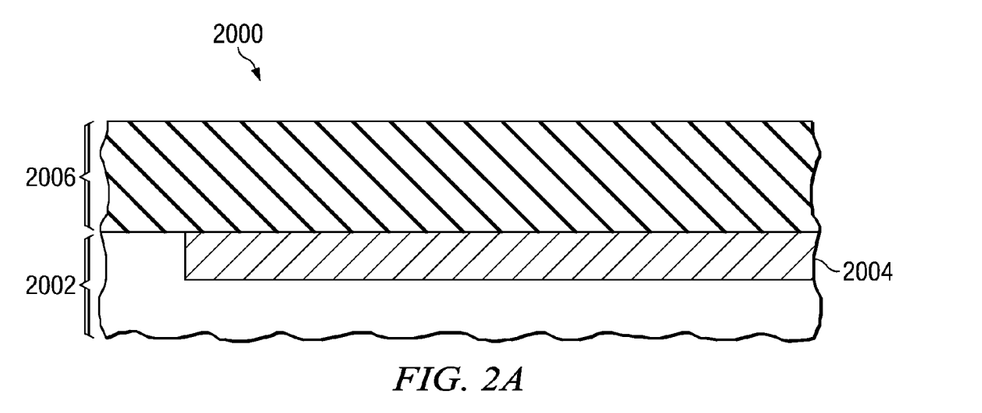
FIG. 2A through FIG. 2E are cross-sections of an embodiment of an integrated circuit containing a vertical interconnect having multiple dielectric pillars, formed by a dual damascene process, depicted in successive stages of fabrication.

FIG. 2A through FIG. 2E are cross-sections of an embodiment of an integrated circuit containing a vertical interconnect having multiple dielectric pillars, formed by a dual damascene process, depicted in successive stages of fabrication. Referring to FIG. 2A, the integrated circuit (2000) includes a lower region (2002), which may be a dielectric layer in an interconnect region. A lower conductive structure which is a lower lateral interconnect (2004) is formed in the lower region (2002). In some embodiments, the lower lateral interconnect (2004) may be a lateral interconnect member of a metallization system in an interconnect region of the integrated circuit (2000). In such embodiments, the lower lateral interconnect (2004) may include tungsten, tungsten nitride, titanium, titanium nitride, titanium tungsten, titanium tungsten nitride, tantalum, tantalum nitride or copper.

Fabrication of the vertical interconnect proceeds with formation of an inter-level dielectric (ILD) layer (2006) on a top surface of the lower lateral interconnect (2004). The ILD layer (2006) may include one or more sub-layers of silicon dioxide, silicon nitride, silicon oxy-nitride, PSG, BPSG, low-k dielectric material such as OSG, CDO or MSQ, or ultra low-k dielectric material such as p-OSG. The ILD layer (2006) may further include one or more via etch stop layers located in a bottom region of the ILD layer (2006). The via etch stop layers may include silicon nitride, silicon carbide, silicon carbide nitride, silicon oxy-carbide, silicon oxy-carbide nitride or aluminum oxide. The ILD layer (2006) may further include one or more trench etch stop layers located in a middle region of the ILD layer (2006). The trench etch stop layer may also include silicon nitride, silicon carbide, silicon carbide nitride, silicon oxy-carbide, silicon oxy-carbide nitride or aluminum oxide. The ILD layer (2006) may further include one or more hard mask layers located in a top region of the ILD layer (2006). The hard mask layers may include silicon nitride, silicon carbide, silicon carbide nitride, silicon oxy-carbide, silicon oxy-carbide nitride or aluminum oxide. The ILD layer (2006) may be formed by CVD, PECVD, LPCVD, APCVD, HDP, HARP, ALD, or other suitable dielectric layer formation process.

Figure 2B:
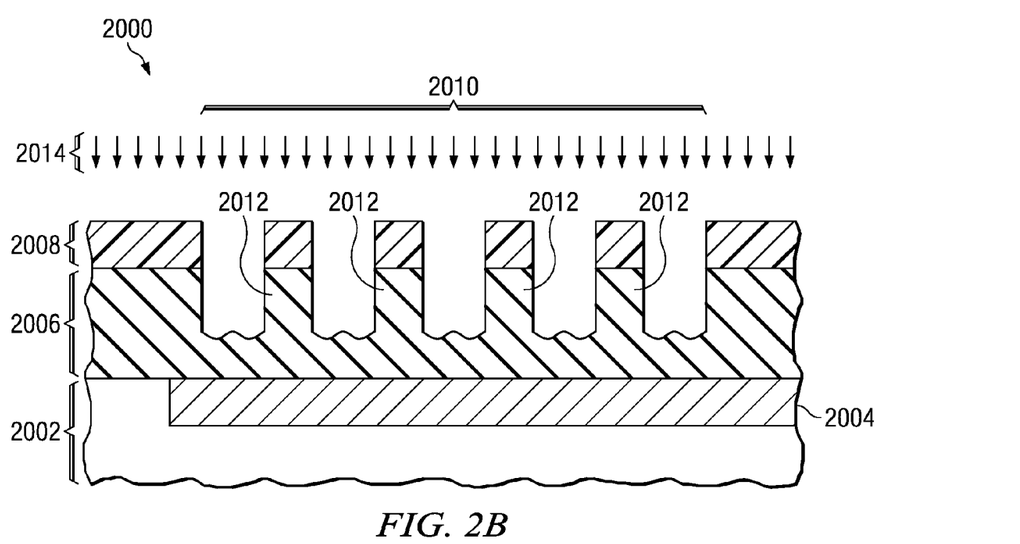

In the instant embodiment, the vertical interconnect is formed by a variation of the dual damascene process commonly known as a via-first sequence. Referring to FIG. 2B, a vertical interconnect photoresist pattern (2008) is formed over the ILD layer (2006) to define an area for removal of the dielectric material in a vertical interconnect area (2010) by exposing a top surface of the ILD layer (2006). The vertical interconnect photoresist pattern (2008) includes areas for dielectric pillars (2012) interior to the vertical interconnect area (2010). Material is removed from the ILD layer (2006) using the vertical interconnect photoresist pattern (2008) during a via plasma etching process (2014) such as reactive ion etching (which may include fluorine ions or possibly other halogen ions) in the region where interconnect metal is desired. In the instant embodiment, the via plasma etching process (2014) is performed so as to leave the dielectric material of the ILD layer (2006) over the lower lateral interconnect (2004) in the region where interconnect metal is desired. In alternate embodiments, the via plasma etching process (2014) may be performed for a longer period of time—so as to expose the top surface of the lower lateral interconnect (2004) in the region where interconnect metal is desired.

Figure 2C:
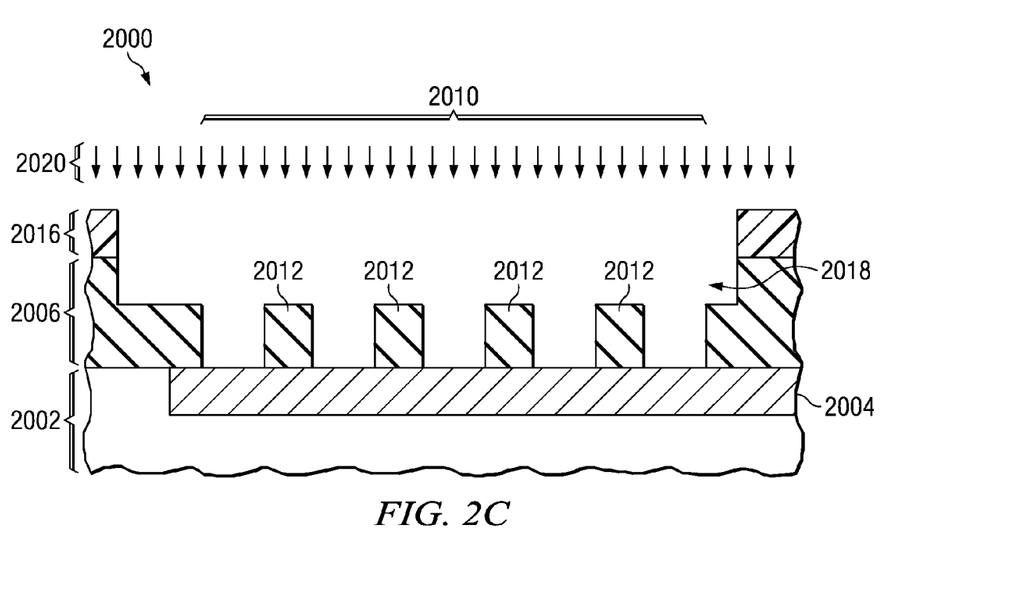

FIG. 2C depicts the integrated circuit (2000) during a process to form a trench for an upper lateral interconnect. An upper lateral interconnect photoresist pattern (2016) is formed over the ILD layer (2006) to define an area for removal of the dielectric material in an upper lateral interconnect trench (2018). Material is removed from the ILD layer (2006) in the upper lateral interconnect trench (2018) through the upper lateral interconnect photoresist pattern (2016), using a trench plasma etching process (2020) such as reactive ion etching. The top surface of the lower lateral interconnect (2004) is exposed in the region where interconnect metal is desired.

Figure 2D:
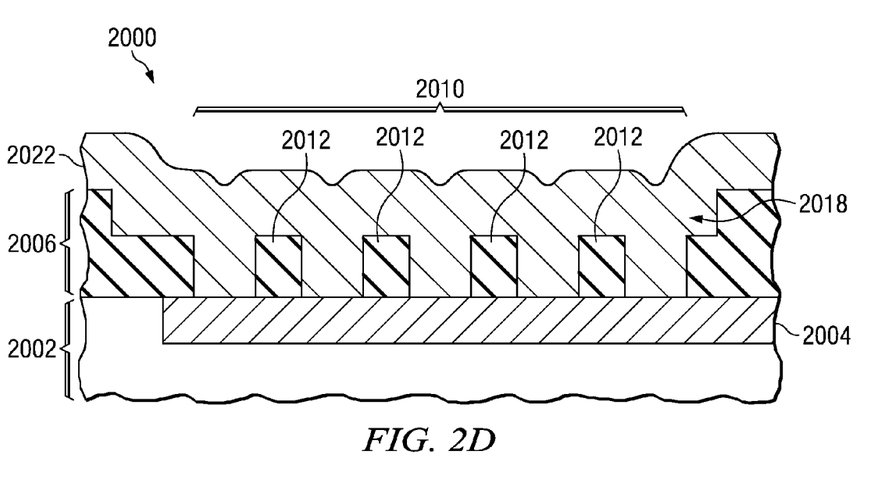

FIG. 2D depicts the integrated circuit (2000) after a layer of interconnect metal (2022) is formed on exposed surfaces of the ILD layer (2006), pillars (2012) and lower lateral interconnect (2004), in the region where interconnect metal is desired and in the upper lateral interconnect trench (2018). The interconnect metal layer (2022) may include one or more layers of liner metal such as tungsten, tungsten nitride, titanium, titanium nitride, titanium tungsten, titanium tungsten nitride, tantalum, tantalum nitride. The layer of liner metal may be formed by evaporation, sputtering, PVD, CVD, MOCVD, ion plating, ALD or other formations process appropriate for thin metal films. The interconnect metal layer (2022) may include copper or other metal appropriate for a dual damascene process. Copper may be used to form the layer of interconnect metal (2022) by processes such as evaporation, sputtering, PVD, or electroplating.

Figure 2E:
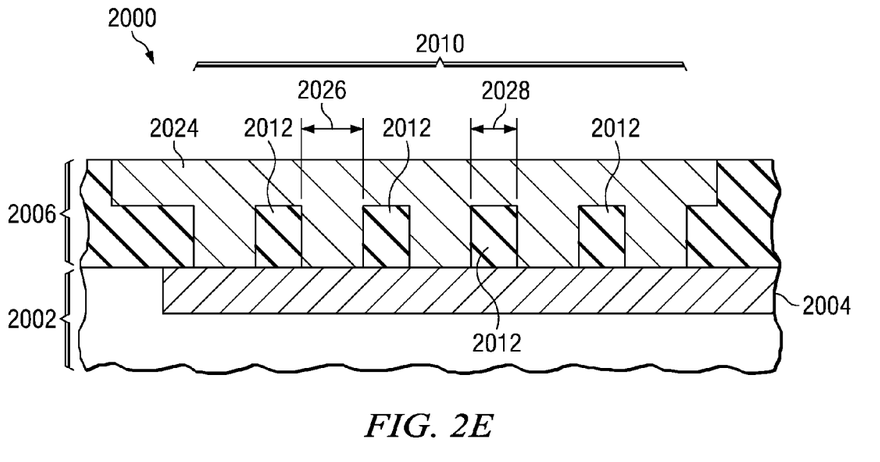

FIG. 2E depicts the integrated circuit (2000) after an interconnect metal removal process which removes interconnect metal (2022 in FIG. 2D) from the top surface of the ILD layer (2006) to leave an upper conductive structure which is an upper lateral interconnect (2024) and the vertical interconnect. A bottom surface of the upper lateral interconnect (2024) contacts a top surface of the lower lateral interconnect (2004). The interconnect metal removal process commonly includes a CMP operation as described in reference to FIG. 1E. A lateral distance (2026) between pillars (2012) is selected so that a top surface of the upper lateral interconnect (2024) between the pillars (2012) does not dip below a plane containing the top surface of the ILD layer (2006). A horizontal size (2028) of the pillars (2012) is selected minimize a combined area of the pillars (2012) in the vertical interconnect area (2010), while providing sufficient adhesion of the pillars (2012) to the lower lateral interconnect (2004) during the via and trench plasma etching processes, photoresist pattern removal processes and interconnect metal layer formation processes. Experiments conducted during development of embodiments indicate that pillar horizontal sizes (2028) between 1.5 and 2.0 times a deposition thickness of the interconnect metal layer (2022 in FIG. 2D) may provide an acceptable balance between the aforementioned criteria.

It will be recognized that the vertical interconnect (2024) located in the vertical interconnect area (2010) and described in reference to FIG. 2A through FIG. 2E may be formed by other variations of dual damascene processes. In alternate embodiments, variations of the dual damascene processes commonly known as trench-first process sequences may be used.

Figure 3A:
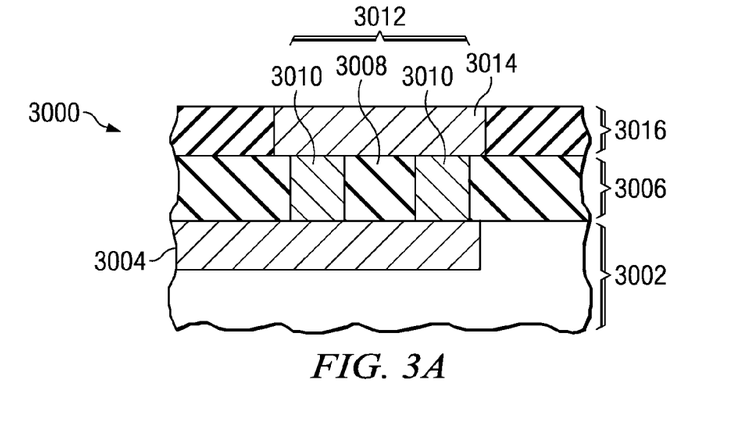
FIG. 3A and FIG. 3B are a cross-section and a top view, respectively, of an embodiment of an integrated circuit containing a vertical interconnect with one dielectric pillar.
Figure 3B:
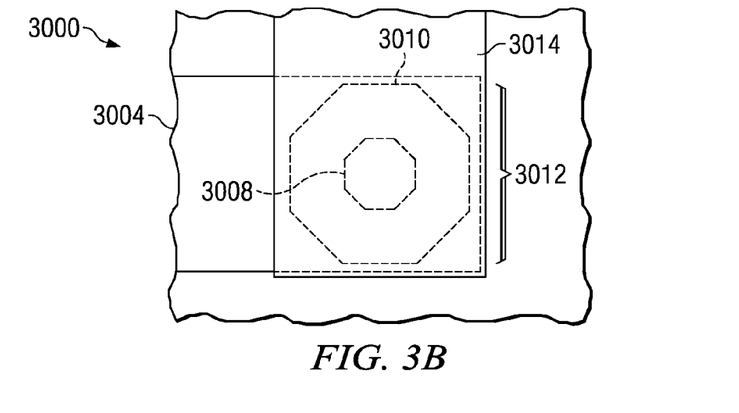

FIG. 3A and FIG. 3B are a cross-section and a top view, respectively, of an embodiment of an integrated circuit containing a vertical interconnect with one dielectric pillar, formed according to the process fabrication sequence described in reference to FIG. 1A through FIG. 1E. Referring to FIG. 3A, the integrated circuit (3000) includes a lower region (3002), which may be a substrate or a dielectric layer in an interconnect region of the integrated circuit (3000). A lower conductive structure (3004) is formed in the lower region (3002), which may be part of a component in the substrate or may be a lateral interconnect member of a metallization system of the integrated circuit (3000). A dielectric layer (3006) on a top surface of the lower conductive structure (3004) may include one or more sub-layers of silicon dioxide, silicon nitride, silicon oxy-nitride, low-k dielectric material or ultra low-k dielectric material. The dielectric layer (3006) may further include one or more etch stop layers or one or more hard mask layers. A continuous interconnect metal region (3010) surrounding a single dielectric pillar (3008) is formed in the dielectric layer (3006). The interconnect metal region (3010) may include an optional layer of liner metal. Interconnect metal in the interconnect metal region (3010) may include tungsten, titanium nitride, ruthenium, gold, silver, copper, or aluminum. Sections of the continuous interconnect metal region (3010) depicted in FIG. 3A are joined at points above and below a plane of FIG. 3A. In typical embodiments, a horizontal distance from a perimeter of the dielectric pillar (3008) to a perimeter of the continuous interconnect metal region (3010) is approximately equal to twice a thickness of the layer of interconnect metal (1020 of FIG. 1C) as formed on the top surface of the dielectric layer (3006). The continuous interconnect metal region (3010) and the dielectric pillar (3008) may characterize the vertical interconnect (3012). An upper conductive structure (3014) is formed on the top surfaces of the dielectric layer (3006), the dielectric pillar (3008) and the continuous interconnect metal region (3010). The upper conductive structure (3014) may be a lateral interconnect member of a metallization system. An upper dielectric layer (3016) may be formed on the top surface of the dielectric layer (3006) around the upper conductive structure (3014).

Referring to FIG. 3B, the lower conductive structure (3004) extends under an area for the vertical interconnect (3012). The vertical interconnect (3012) includes the dielectric pillar (3008) and the continuous interconnect metal region (3010), as described in reference to FIG. 3A. The upper conductive structure (3014) extends over an area for the vertical interconnect (3012). Therefore, the continuous interconnect metal region (3010) electrically connects the lower conductive structure (3004) to the upper conductive structure (3014).

Figure 4A:
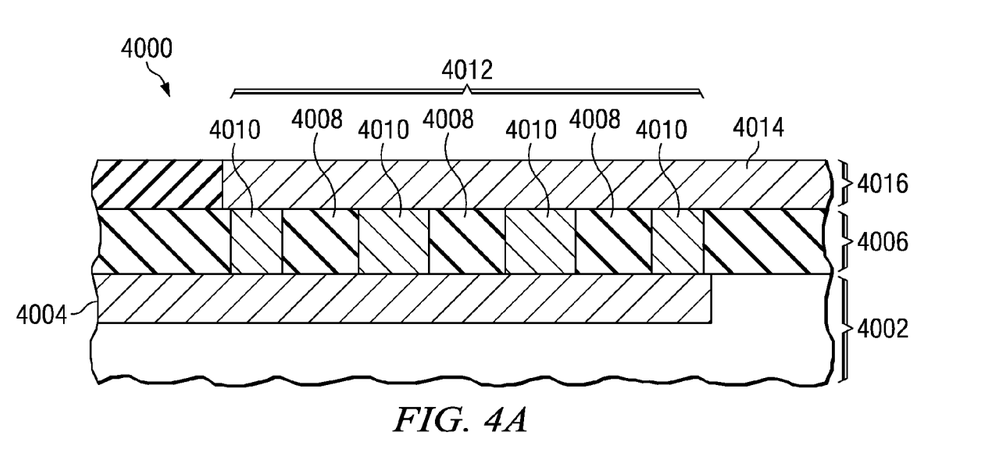
FIG. 4A and FIG. 4B are a cross-section and a top view, respectively, of an embodiment of an integrated circuit containing a vertical interconnect with a single row of dielectric pillars.
Figure 4B:
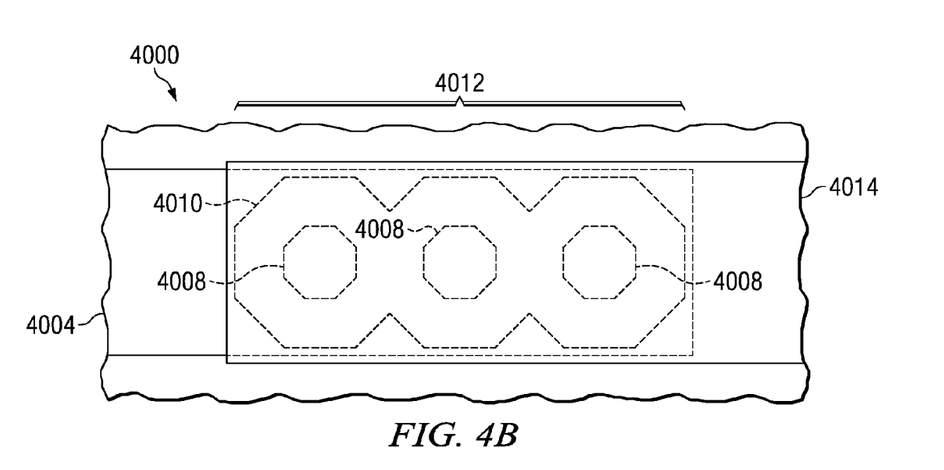

FIG. 4A and FIG. 4B are a cross-section and a top view, respectively, of an embodiment of an integrated circuit containing a vertical interconnect with a single row of dielectric pillars, formed according to the process fabrication sequence described in reference to FIG. 1A through FIG. 1E. Referring to FIG. 4A, the integrated circuit (4000) includes a lower region (4002), as described in reference to FIG. 3A. A lower conductive structure (4004) is formed in the lower region (4002), which may be part of a component in the substrate or may be a lateral interconnect member of a metallization system of the integrated circuit (4000). A dielectric layer (4006) on a top surface of the lower conductive structure (4004) may include one or more sub-layers of silicon dioxide, silicon nitride, silicon oxy-nitride, low-k dielectric material or ultra low-k dielectric material. The dielectric layer (4006) may further include one or more etch stop layers or one or more hard mask layers. A continuous interconnect metal region (4010) surrounding a single row of dielectric pillars (4008) is formed in the dielectric layer (4006). In one embodiment, the dielectric pillars (4008) are uniformly spaced. The interconnect metal region (4010) may include an optional layer of liner metal, and may include tungsten, tungsten nitride, titanium, titanium nitride, titanium tungsten, titanium tungsten nitride, tantalum, tantalum nitride, aluminum, copper, gold, silver or ruthenium, as described in reference to FIG. 3A. Sections of the continuous interconnect metal region (4010) depicted in FIG. 4A are joined at points above and below a plane of FIG. 4A. A horizontal distance between pillars (4008) and a horizontal distance from a perimeter of the dielectric pillars (4008) to a perimeter of the interconnect metal region (4010) are selected so that a top surface of the interconnect metal region (4010) does not dip below a plane containing the top surface of the dielectric layer (4006). In typical embodiments, the horizontal distance between pillars (4008) and the horizontal distance from a perimeter of the dielectric pillars (4008) to a perimeter of the continuous interconnect metal region (4010) are approximately equal to twice a thickness of the layer of interconnect metal (1020 of FIG. 1C) as formed on the top surface of the dielectric layer (4006). A horizontal size of the pillars (4008) is selected minimize a combined area of the pillars (4008) in the vertical interconnect (4012), while providing sufficient adhesion of the pillars (4008) to the lower conductive structure (4004) during fabrication processes, as described in reference to FIG. 1B through FIG. 1D. The continuous interconnect metal region (4010) and the dielectric pillars (4008) may characterize the vertical interconnect (4012). An upper conductive structure (4014) is formed on the top surfaces of the dielectric layer (4006), the dielectric pillar (4008) and the continuous interconnect metal region (4010). The upper conductive structure (4014) may be a lateral interconnect member of a metallization system. An upper dielectric layer (4016) may be formed on the top surface of the dielectric layer (4006) around the upper conductive structure (4014).

Referring to FIG. 4B, the lower conductive structure (4004) extends under an area for the vertical interconnect (4012). The vertical interconnect (4012) includes the dielectric pillars (4008) and the continuous interconnect metal region (4010), as described in reference to FIG. 4A. The upper conductive structure (4014) extends over an area for the vertical interconnect (4012). The continuous interconnect metal region (4010) electrically connects the lower conductive structure (4004) to the upper conductive structure (4014).

Figure 5:
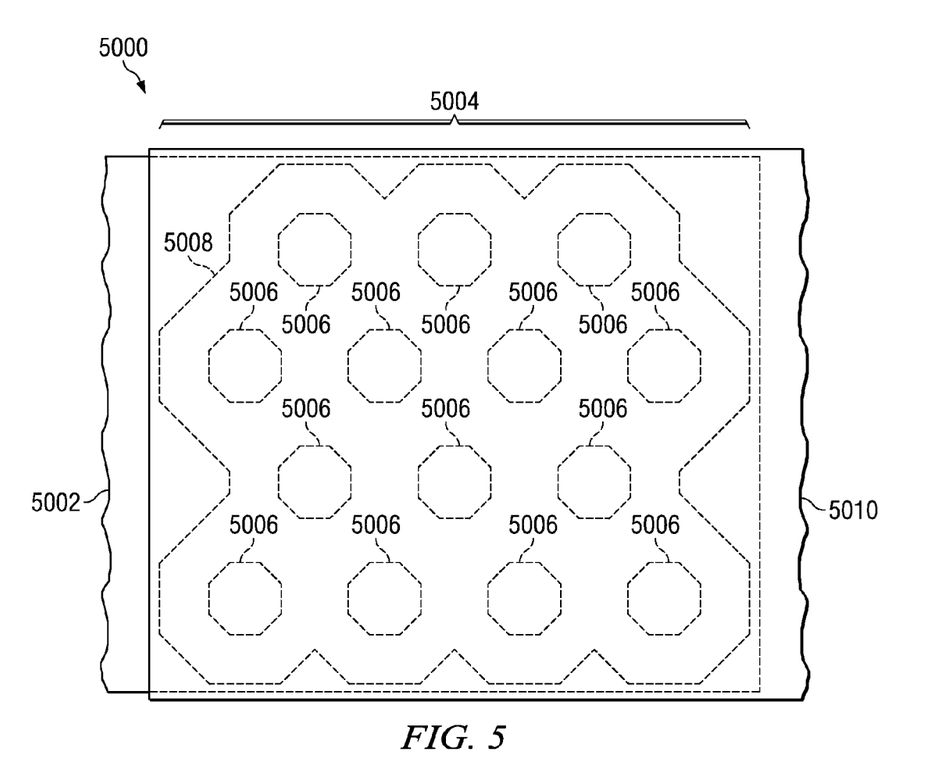
FIG. 5 is a top view of an embodiment of an integrated circuit containing a vertical interconnect with a two dimensional array of dielectric pillars.

FIG. 5 is a top view of an embodiment of an integrated circuit containing a vertical interconnect with a two dimensional array of dielectric pillars, formed according to the process fabrication sequence described in reference to FIG. 1A through FIG. 1E. The integrated circuit (5000) contains a lower conductive structure (5002) which extends under an area for the vertical interconnect (5004). The vertical interconnect (5004) includes an array of dielectric pillars (5006) and the continuous interconnect metal region (5008), as described in reference to FIG. 5A. The upper conductive structure (5010) extends over the area for the vertical interconnect (5004). The continuous interconnect metal region (5008) electrically connects the lower conductive structure (5002) to the upper conductive structure (5010). In one embodiment, the dielectric pillars (5006) are substantially equal in size. In another embodiment, the dielectric pillars (5006) in each row are uniformly spaced. In a yet another embodiment, every other row of pillars (5006) is laterally offset by one-half of a column spacing. A size of the pillars (5006) is selected for robustness during fabrication, as related in reference to FIG. 1B through FIG. 1D. Horizontal spacing between the pillars (5006) and a horizontal distance between the pillars and a perimeter of the continuous interconnect metal region (5008) are selected to maximize an amount of interconnect metal (5008) in the vertical interconnect (5004) while maintaining a substantially planar top surface of the interconnect metal (5008), as described in reference to FIG. 1C and FIG. 1D. In one embodiment, a configuration of pillars (5006) may be selected to reduce a ratio between a lateral electrical resistance and a lateral electrical current flow through the continuous interconnect metal region (5008).

Figure 6A:
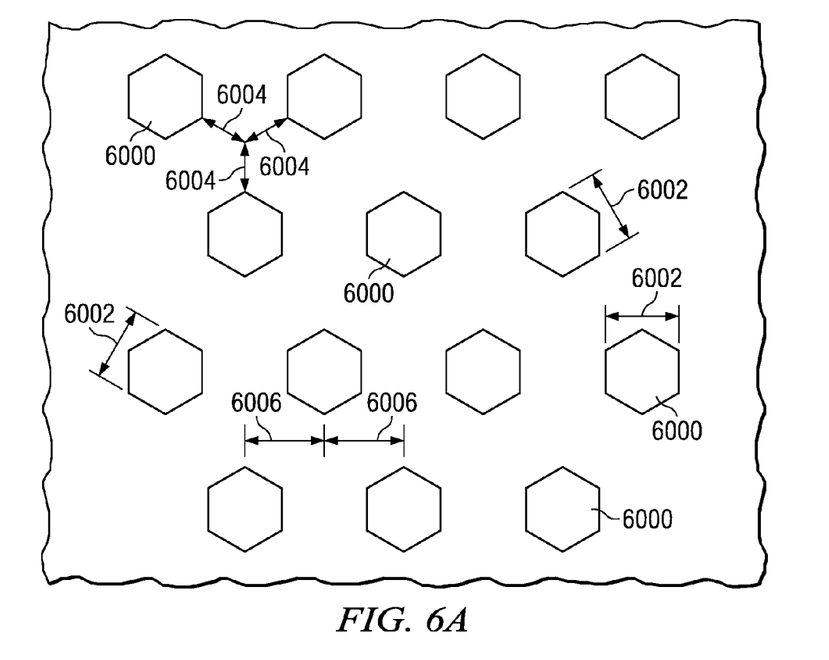
FIG. 6A through FIG. 6D depict configurations of dielectric pillars in different embodiments.

FIG. 6A through FIG. 6D depict configurations of dielectric pillars in different embodiments. Referring to FIG. 6A, each pillar (6000) has a substantially hexagon shape, with a width (6002) which is preferably between 1.5 and 2 times a deposition thickness (e.g. 1020 of FIG. 1C) of interconnect metal in an interconnect metal deposition process. A point substantially equidistant from three neighboring pillars is separated by a distance (6004) from each pillar which is preferably substantially equal to the deposition thickness (e.g. 1020 of FIG. 1C) of interconnect metal in the interconnect metal deposition process. Every second row of pillars (6000) is laterally offset by one-half of a column width (6006). As shown in FIG. 6A, two half-column widths (6006) equals a width of a column of pillars (6000). In an alternate embodiment, the pillars (6000) may be configured in a hexagonal array.

Figure 6B:
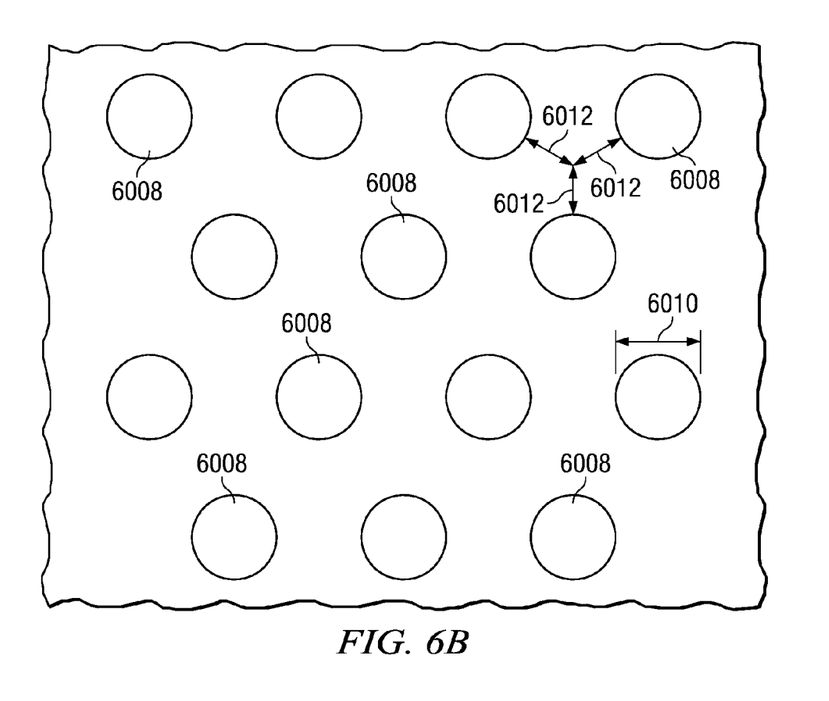

Referring to FIG. 6B, each pillar (6008) has a substantially circular shape, with a diameter (6010) which is preferably between 1.5 and 2 times a deposition thickness (e.g. 1020 of FIG. 1C) of interconnect metal in an interconnect metal deposition process. A point substantially equidistant from three neighboring pillars is separated by a distance (6012) from each pillar which is preferably substantially equal to the deposition thickness (e.g. 1020 of FIG. 1C) of interconnect metal in the interconnect metal deposition process. Every second row of pillars (6008) is laterally offset by one-half of a column width. In an alternate embodiment, the pillars (6008) may be configured in a hexagonal array.

Figure 6C:
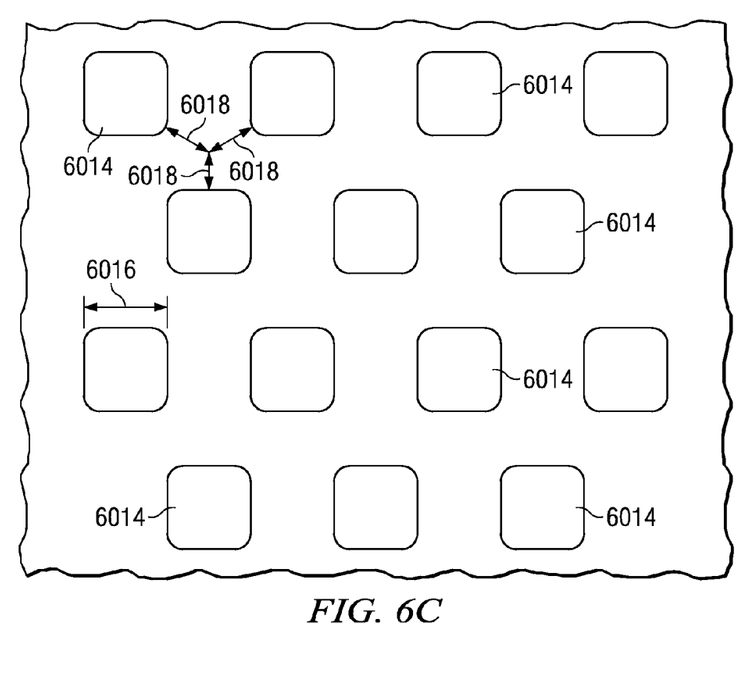

Referring to FIG. 6C, each pillar (6014) has a substantially square shape with rounded corners, with a width (6016) which is preferably between 1.5 and 2 times a deposition thickness (e.g. 1020 of FIG. 1C) of interconnect metal in an interconnect metal deposition process. A point substantially equidistant from three neighboring pillars is separated by a distance (6018) from each pillar which is preferably substantially equal to the deposition thickness (e.g. 1020 of FIG. 1C) of interconnect metal in the interconnect metal deposition process. Every second row of pillars (6014) is laterally offset by one-half of a column width. In an alternate embodiment, the pillars (6014) may be configured in a hexagonal array.

Figure 6D:
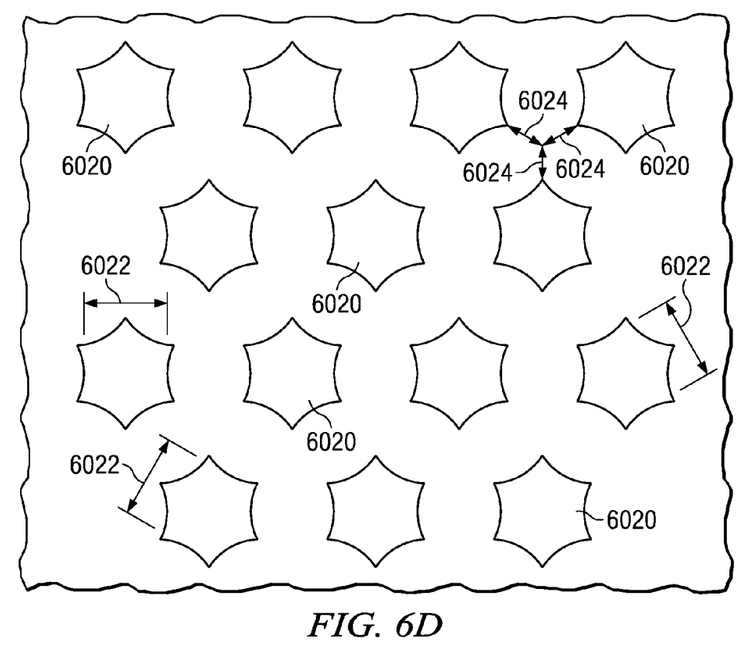

Referring to FIG. 6D, each pillar (6020) has a substantially six-pointed star shape, with a width (6022) which is preferably between 1.5 and 2 times a deposition thickness (e.g. 1020 of FIG. 1C) of interconnect metal in an interconnect metal deposition process. A point substantially equidistant from three neighboring pillars is separated by a distance (6024) from each pillar which is preferably substantially equal to the deposition thickness (e.g. 1020 of FIG. 1C) of interconnect metal in the interconnect metal deposition process. Every second row of pillars (6020) is laterally offset by one-half of a column width. In an alternate embodiment, the pillars (6020) may be configured in a hexagonal array.

It is within the scope of the instant embodiment to form dielectric pillars of other shapes than those disclosed in reference to FIG. 6A through FIG. 6D, for example, ellipsoidal or rectangular shaped pillars. It is also within the scope of the instant embodiment to array the pillars in other configurations than the offset row configurations disclosed in reference to FIG. 6A through FIG. 6D, for example a rectangular array.

Figure 7:
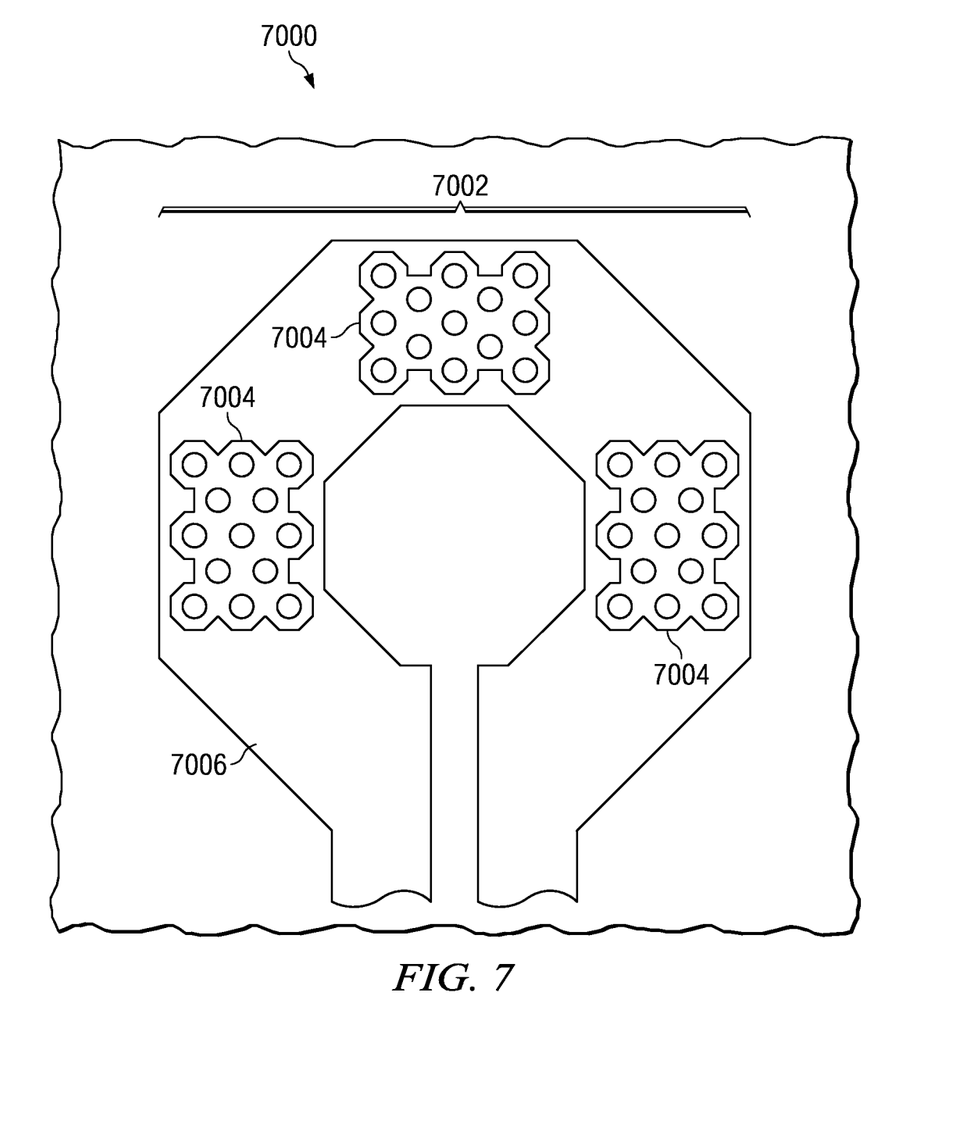
FIG. 7 is a top view of an integrated circuit containing an inductor with vertical interconnects formed on a lower winding, according to an embodiment.

There are several specific embodiments which may benefit from a vertical interconnect formed according to the instant invention. FIG. 7 is a top view of an integrated circuit (7000) containing an inductor (7002) with vertical interconnects (7004) formed on a lower winding (7006), according to an embodiment. The inductor (7002) includes an upper winding, not shown, over the lower winding (7006). The vertical interconnects (7004) provide electrical connections between the lower winding (7006) and the upper winding. In other embodiments of inductors, vertical interconnects may have other configurations of pillars, including solitary pillars and single rows of pillars, as described in reference to FIG. 3B and FIG. 4B, respectively. Inductors with windings connected by vertical interconnects formed according to embodiments as depicted in FIG. 7 may advantageously exhibit lower dissipative losses during AC circuit operation than similar inductors which do not connect windings.

Figure 8:
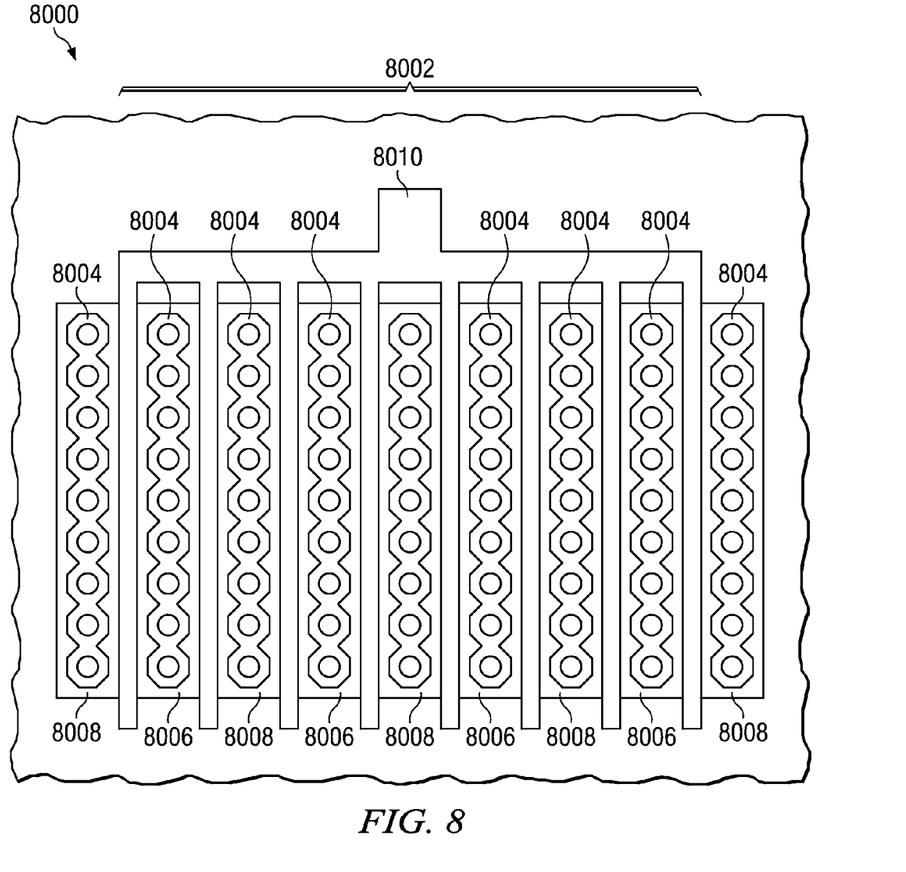
FIG. 8 is a top view of an integrated circuit containing a high current transistor with vertical interconnects formed on source and drain regions according to an embodiment.

FIG. 8 is a top view of an integrated circuit (8000) containing a high current transistor (8002) with vertical interconnects (8004) formed according to an embodiment on source (8006) and drain (8008) regions. The transistor (8002) includes a gate (8010) with fingers separating the source (8006) and drain (8008) regions. In other embodiments of high current transistors, vertical interconnects on source and rain regions may have other configurations of pillars, including solitary pillars and arrays of pillars in rows and columns, as described in reference to FIG. 3B and FIG. 5, respectively. Metal source and drain leads, not shown are formed over the transistor (8002) and connect to top surfaces of the vertical interconnects (8004) to provide connections between the transistor (8002) and other components in the integrated circuit (8000). High current transistors with vertical interconnects on source and rain regions formed according to embodiments may advantageously exhibit lower series resistance and higher operating current than similar transistors without the inventive vertical interconnects.

Figure 9:
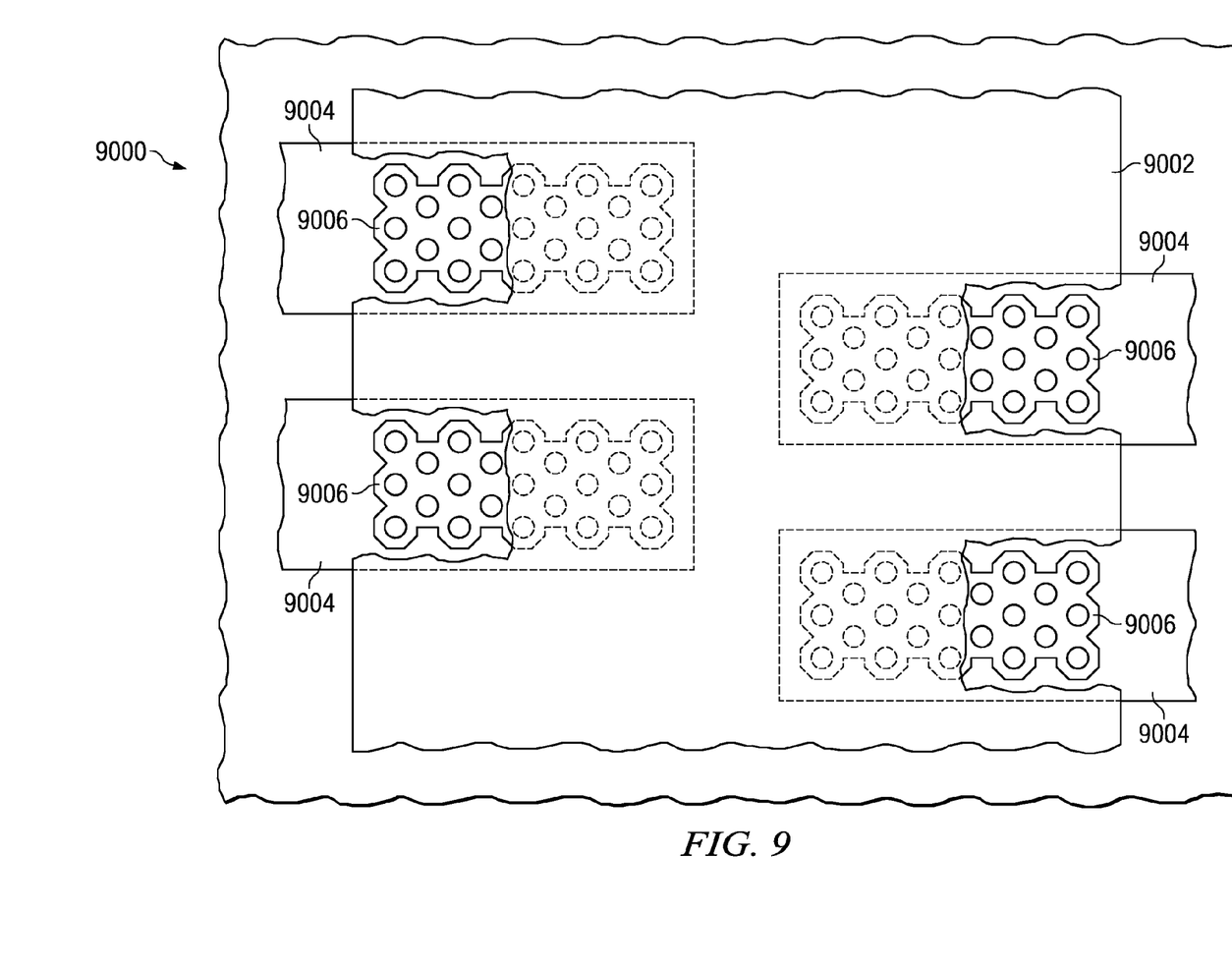
FIG. 9 is a top view of an integrated circuit containing a power supply distribution network which includes an upper power supply bus and lower supply buses.

FIG. 9 is a top view of an integrated circuit (9000) containing a power supply distribution network which includes an upper power supply bus (9002) and lower power supply buses (9004). The lower power supply buses (9004) are connected to the upper power supply bus (9002) by vertical interconnects (9006) formed according to an embodiment. In other embodiments of power supply bus connections, vertical interconnects may have other configurations of pillars, including solitary pillars or single rows of pillars, as described in reference to FIG. 3B and FIG. 4B, respectively. Power supply buses connected by vertical interconnects that are formed according to these embodiments may advantageously exhibit lower series resistance than similar power supply buses connected by other means than the inventive vertical interconnects.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A process of forming an integrated circuit, comprising the steps of:
    forming a lower conductive structure;
    forming a vertical interconnect by a process further including the steps of:
        forming at least one dielectric pillar on a top surface of said lower conductive structure;
        forming a region of interconnect metal, such that said interconnect metal continuously surrounds each said at least one dielectric pillar, every location in said interconnect metal region is within a desired maximum horizontal distance from a boundary of said interconnect metal, and said interconnect metal electrically contacts said lower conductive structure, wherein said boundary includes edges of said interconnect metal region and perimeters of said pillars. wherein a top surface of said interconnect metal and a top surface of each said at least one dielectric pillar are substantially coplanar; and forming an upper conductive structure, said upper conductive structure contacts a top surface of said vertical interconnect.

2. The process of claim 1, in which said vertical interconnect includes exactly one said pillar.

3. The process of claim 1, in which said vertical interconnect includes exactly one linear row of said pillars.

4. The process of claim 1, in which said vertical interconnect includes an array of said pillars, said array containing rows of said pillars and columns of said pillars, and every other row of said pillars is laterally offset by one-half of a column spacing.

5. The process of claim 4, in which a horizontal width of each of said pillars is between 1 and 2.5 times said desired maximum horizontal distance.

6. The process of claim 1, in which said interconnect metal includes a metal selected from the group consisting of:
tungsten,
tungsten nitride,
titanium,
titanium nitride,
titanium tungsten,
titanium tungsten nitride,
tantalum,
tantalum nitride,
aluminum,
copper,
gold,
silver, and
ruthenium.

7. The process of claim 1, in which said lower conductive structure includes a conductive material selected from the group consisting of:
polysilicon,
metal silicide,
tungsten,
tungsten nitride,
titanium,
titanium nitride,
titanium tungsten,
titanium tungsten nitride,
tantalum,
tantalum nitride,
aluminum,
copper,
gold,
silver, and
ruthenium.

8. The process of claim 1, in which said upper conductor includes a conductive material selected from the group consisting of:
tungsten,
tungsten nitride,
titanium,
titanium nitride,
titanium tungsten,
titanium tungsten nitride,
tantalum,
tantalum nitride,
aluminum,
copper,
gold,
silver, and
ruthenium.

* * * * *